United States Patent [19]

White

[11] Patent Number: 4,543,558

[45] Date of Patent: Sep. 24, 1985

[54] METHOD AND APPARATUS FOR CONVERTING RADIANT ENERGY LEVELS TO DIGITAL DATA

[75] Inventor: James A. White, Elkhart, Ind.

[73] Assignee: Miles Laboratories, Inc., Elkhart, Ind.

[21] Appl. No.: 475,090

[22] Filed: Mar. 14, 1983

[51] Int. Cl.$^4$ .............................................. H03K 13/08
[52] U.S. Cl. ......................... 340/347 AD; 340/347 M; 356/229; 356/230; 377/42
[58] Field of Search .... 340/347 AD, 347 M, 347 CC; 250/231 SE, 237 G; 356/222, 229, 230; 377/42

[56] References Cited

U.S. PATENT DOCUMENTS 3,100,298  8/1963  Fluhr ........................... 340/347 AD

OTHER PUBLICATIONS

The Engineering Staff of Analog Devices, Inc., Analog-Digital Conversion Handbook, 6/1972, pp. II-46 to II-48; II-80 to II-83.

Primary Examiner—T. J. Sloyan
Attorney, Agent, or Firm—Roger N. Coe

[57] ABSTRACT

A method and apparatus for converting radiant energy levels to digital data wherein an image sensor is provided having at least one row of sensor elements each including a light sensitive capacitor and an access switch and which changes state produces a corresponding binary output signal when a predetermined charge threshold is exceeded by the capacitor whose charge is a function of intensity and period of an illumination. The row of elements is first calibrated by illuminating same with a reference light source and sensing at a first frequency (F) such that approximately one half of the elements change state and counting the digital output signals corresponding to the changes of state to obtain a first number (B). Thereafter, the row is illuminated with an unknown light source which has a lower radiant energy level than that of the reference light source and senses at a frequency F/2. The digital output signals corresponding to the changes of state are counted to obtain a second number (A). The numbers A and B are compared to produce a digital "1" signal when A>B and a digital "0" when A<B corresponding to digital data bit $N_1$. The sensing and comparing are repeated for each successive bit $N_2, N_3 \ldots N_k$ of a K bits of digital data at successive sensing frequencies in accordance with $$\frac{F \times N_1}{2^1} + \frac{F \times N_2}{2^2} + \frac{F \times N_3}{2^3} + \ldots \frac{F \times N_k}{2^k}.$$

12 Claims, 4 Drawing Figures

METHOD AND APPARATUS FOR CONVERTING RADIANT ENERGY LEVELS TO DIGITAL DATA

BACKGROUND OF THE INVENTION

The present invention relates to a method and an apparatus for converting a level of radiant energy, ultraviolet through infrared, to a digital value.

In the measurement of radiant energy such as the spectral and intensity data measured by a spectrophotometer, it is desirable to have this information available as digital data so that it can be easily processed by computers without the errors associated with analog measurements.

In a spectrophotometer, intensity in spectral content of a light source itself or the reflectance of a particular material can be measured. Characteristically, the spectrophotometer has an entrance slit and a photo detector or photo diode array as the light measuring device.

Recently, an image sensor, the IS 32 image sensor produced by Micron Technology Inc. of Boise, Id., which is basically a dynamic random access memory chip that has been optimized for radiant energy sensitivity, has become commercially available.

The device is a dual 128×256 array of light sensing elements and capacitors where the charge on each capacitor is proportional to the current generated by the light sensing element. When it is desired to read out the charge level on a capacitor, the address for that element location is input to the image sensor and the charge level is then detected by a comparator to determine if the charge is greater or less than a preset threshold. The comparator output is then in either a low or a high state which defines the charge level to be less than or greater than the preset threshold. Thus, by scanning the array element by element, an output pulse train is obtained which provides a binary representation of the state of each element at the time of the scan. The charge level of each capacitor can be varied by either changing the light level impinging on the array or by changing the charging time for each capacitor.

The details of the construction of the device are hereby incorporated by reference herein.

SUMMARY OF THE INVENTION

The main object of the present invention is to provide a novel and unique method and apparatus for converting a level of radiant energy to a digital value, in particular a multi-bit digital data word.

The present invention utilizes the aforementioned image sensor and takes advantage of particular characteristics thereof which heretofore were not considered to be useful or productive.

In accordance with the present invention, a K-bit digital word is obtained which is proportional to an input light level by utilizing the image sensor heretofore discussed. The image sensor is connected to control means which provides row and column addresses and the necessary control inputs to read and write to the image sensor at the proper time. At the start of the conversion cycle, the control means enables a first counter to scan 256 columns of a preselected row. Each time a digital one signal is output from the image sensor, a counter is incremented. It has been discovered that the threshold level for each element varies slightly from element to element and therefore it is possible for some element to exceed the threshold level while others will be below it, at a light level near the threshold level. Because of this anomaly, it has been surprisingly found that it is possible to adjust the light level or the scanning frequency, or both, so as to calibrate the image sensor so that about half of the elements will produce a high level signal at the comparator output.

Utilizing this characteristic of the image sensor, the light level of a reference and/or the oscillation frequency F of a reference oscillator is adjusted in a calibration mode until the first counter indicates a count of about 256 divided 2 which means that about half the charge capacitors for that row are above the threshold level. This value is then retained in the first counter and a second counter is then enabled. The unknown light source or reflecting sample, whose radiant energy level must be less than that of the light source to set the first counter, is then directed to the image sensor and a frequency of $F \div 2$ is used to effect the sensing and to clock the output into the second counter. The value of the second counter is then compared to the value of the first counter, and if the value of the second counter is greater than that of the first counter, the most significant bit in a data register is set to a logic 1. Otherwise, the data bit is set to a logic 0.

A frequency rate multiplier is then set to multiply by ¾ or ¼ the frequency from the oscillator, depending on the state of the first bit in the data register. The second counter is reset to zero and the cycle is repeated. The second bit in the register is then set to a 1 or a 0 depending upon the signal from the magnitude comparison. The above procedure is repeated until all of the K positions in the register have been accounted for. The value in the register is then a measure of the ratio of the light intensity of the initial reference reading compared to the unknown intensity.

The frequency multiplication is carried out by a binary rate multiplier which is used to provide a frequency ratio of the oscillator frequency which is used to set the data into the first counter. The output frequency from the binary rate multiplier is in accordance with:

$$\frac{F \times N_1}{2^1} + \frac{F \times N_2}{2^2} + \frac{F \times N_3}{2^3} + \ldots \frac{F \times N_k}{2^k}$$

where $N_1, N_2 \ldots N_k$ has a value of 1 or 0 depending upon the output of each bit position in the data register. The technique of decreasing the frequency and thereby increasing the period for each sensing provides for a longer charging time on successive trials and lets the capacitor associated with the light sensing element be more fully charged. There will be some frequency that, within the incremental resolution, will make the capacitor charge for the unknown light intensity equal to the charge for the reference light level. Thus, when the complete cycle is finished, the value in the register is a measure of the relative light level of the reference and unknown inputs.

In a particularly advantageous embodiment of the present invention, a computer is used with the image sensor so that the above-mentioned conversion can be repeated for each row of the image sensor. The computer, for example, a Hewlett-Packard Co. HP 85 computer, stores the calibration data for each row in the image sensor. After each reference output has been obtained, the computer then feeds the address of each successive row along with its corresponding reference or calibration data into an address register for the image sensor and into the first counter. The unknown light source is then used to illuminate the image sensor, and the K-bit data word that is obtained for each row is thereafter sent back to the computer so that the digital intensity value for the unknown source can be calculated.

These and other features and advantages of the present invention will become more apparent from the following detailed description of the invention and the accompanying drawings, wherein:

DETAILED DESCRIPTION OF THE PREFERRED EMBODIMENTS

Figure 1:
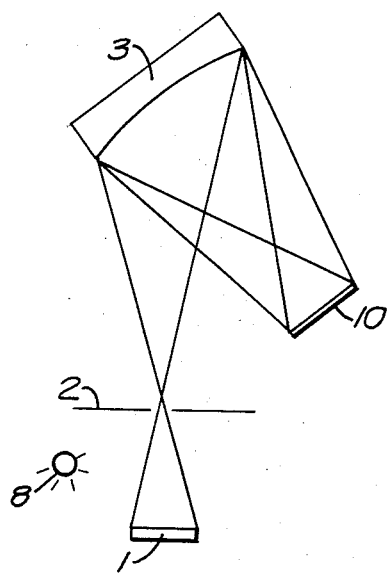
FIG. 1 is a schematic of the optics in accordance with the present invention.

Referring now to FIG. 1, a spectrophotometer has an entrance slit 2 through which radiant energy, either directed from a source 8 or reflected from a sample 1 is received and passed onto a diffraction grating 3 and thereafter to an image sensor 10 located at the image plane.

The image sensor 10 (FIG. 2) is controlled by address and timing signals generated by control circuitry 12. The image sensor receives 8 bits of column address and 8 bits of row address data at the same 8 inputs and has a single data input and a single data output line. The control signals for selecting the access switch include a write signal (WRT) for restoring the element to its original state for sensing again and row and column addressing strobe inputs (RAS, CAS) for the address data.

The control circuit 12 also provides the basic control signals for the frequency rate multiplier 19 and it receives its clock signals for synchronous operation from the oscillator 17.

A preferred image sensor 10 comprises a 256×256 array of light sensing elements and capacitors where the charge on each capacitor is proportional to the current generated by the light sensing element. When it is desired to read out the charge level on a capacitor, the address for that element location is input to a selected access switch for image sensor 10 by the control circuitry 12 and the charge level is then detected by a comparator therein to determine if the charge is greater or less than a preset threshold. The output of the image sensor 10 is a binary output and, by scanning the array in an element by element manner, an output pulse train is obtained which provides a binary representation of the state of each element at the time of the scan.

At the start of a conversion cycle, the control circuit enables counter 14 and causes a scan of 256 columns of a preselected row of image sensor 10. Each time a logic 1 bit is output from the image sensor 10, the counter 14 is incremented. In order to calibrate the system, the oscillator 17 is adjusted so that the frequency F thereof and/or the reference light source 8 (FIG. 1) is adjusted so that a count of about 256 divided by 2 is obtained in reference counter 14. This value is retained in counter 14 for later use.

The unknown source is thereafter used to illuminate the image sensor 10 and a control circuit 12 enables counter 16 to receive the output from image sensor 10.

At this stage, the frequency at which the image sensor writes data therein is set by the rate multiplier 19 at a frequency F/2. The data which is output from the image sensor 10 is counted in sample counter 16 and thereafter, the magnitudes of the count 14 and the counts in counter 16 are compared in magnitude comparator 15. If the magnitude of the sample counter 16 is greater than that of reference counter 14, comparator 15 generates a logic 1. Otherwise, the magnitude comparator 15 generates a logic 0. The value generated by the magnitude comparator 15 is stored in register 18 which has K-bits of storage for a digital conversion to a K-bit digital word. The rate multiplier 19 receives the output from the data bits stored in register 18 and sets itself to multiply the oscillator frequency by a fraction depending upon the data in register 18 and send this new frequency signal to the control circuit 12 for controlling the image sensor 10.

In the particular embodiment disclosed, the frequency divider is set to multiply by $\frac{3}{4}$ or $\frac{1}{4}$ depending upon the state of the first bit in register 18 and counter 16 is reset to 0 and the cycle is repeated. The second bit in register 18 is then set to a 1 or a 0 depending upon the signal from the magnitude comparator 15. The above procedure is repeated for all K-bits (8 bits in the embodiment of FIGS. 3 and 4) of register 18 until all the positions therein have been accounted for. The value in register 18 is a measure of the ratio of the light intensity of the initial reference reading compared to the unknown intensity. The output of the reference counter 14 can be displayed in a display 13 and the output of the register 18 can be displayed in display 20 for use by the user of the equipment.

The binary rate multiplier 19 is used to provide a frequency ratio of the oscillator frequency F of oscillator 17 which is used to set counter 14. The output frequency from the binary rate multiplier takes on the value of $$\frac{F \times N_1}{2^1} + \frac{F \times N_2}{2^2} + \frac{F \times N_3}{2^3} + \ldots \frac{F \times N_k}{2^k}$$

where $N_1, N_2 \ldots N_k$ has a value of 1 or 0 depending upon the output of each bit position in the register 18.

The conversion cycle described above is effective for each row of the 256 rows of image sensor 10. In order to successively obtain the data for each row, a computer 11 is provided which is, for example, a HP 85 digital computer. Computer 11 receives the count from counter 14 for each row of the image sensor 10 along with the value for the reference intensity.

Thereafter, the unknown source is used to illuminate the image sensor for conversion of the radiant energy values thereof for various wavelengths corresponding to the rows of the image sensor 10.

The computer 11 feeds the first row address to the control circuitry 12 and the count therefore to reference counter 14. Thereafter, control circuitry 12 effects the sensing of the illuminating light source at the various frequencies described above to obtain the K-bit word in register 18. The value from register 18 is thereafter fed to the computer for computation with the associated actual radiant energy value for the reference source.

The computer 11 thereafter feeds the next row address to control circuitry 12 and the reference count to counter 14 and the process is repeated for all of the 256 rows or any desired number of rows.

The computer is thereafter able to compute the actual radiant energy value for each of the wavelengths from the data obtained in the apparatus.

Figure 2:
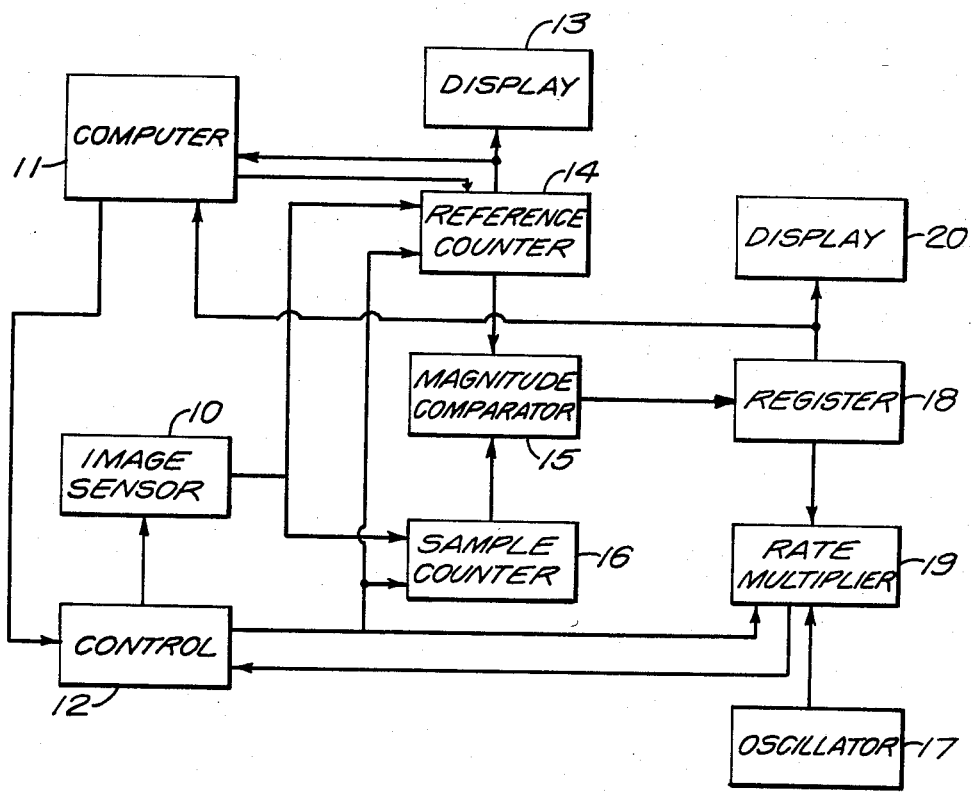
FIG. 2 is a block diagram of the apparatus for carrying out the method in accordance with the present invention.
Figure 3:
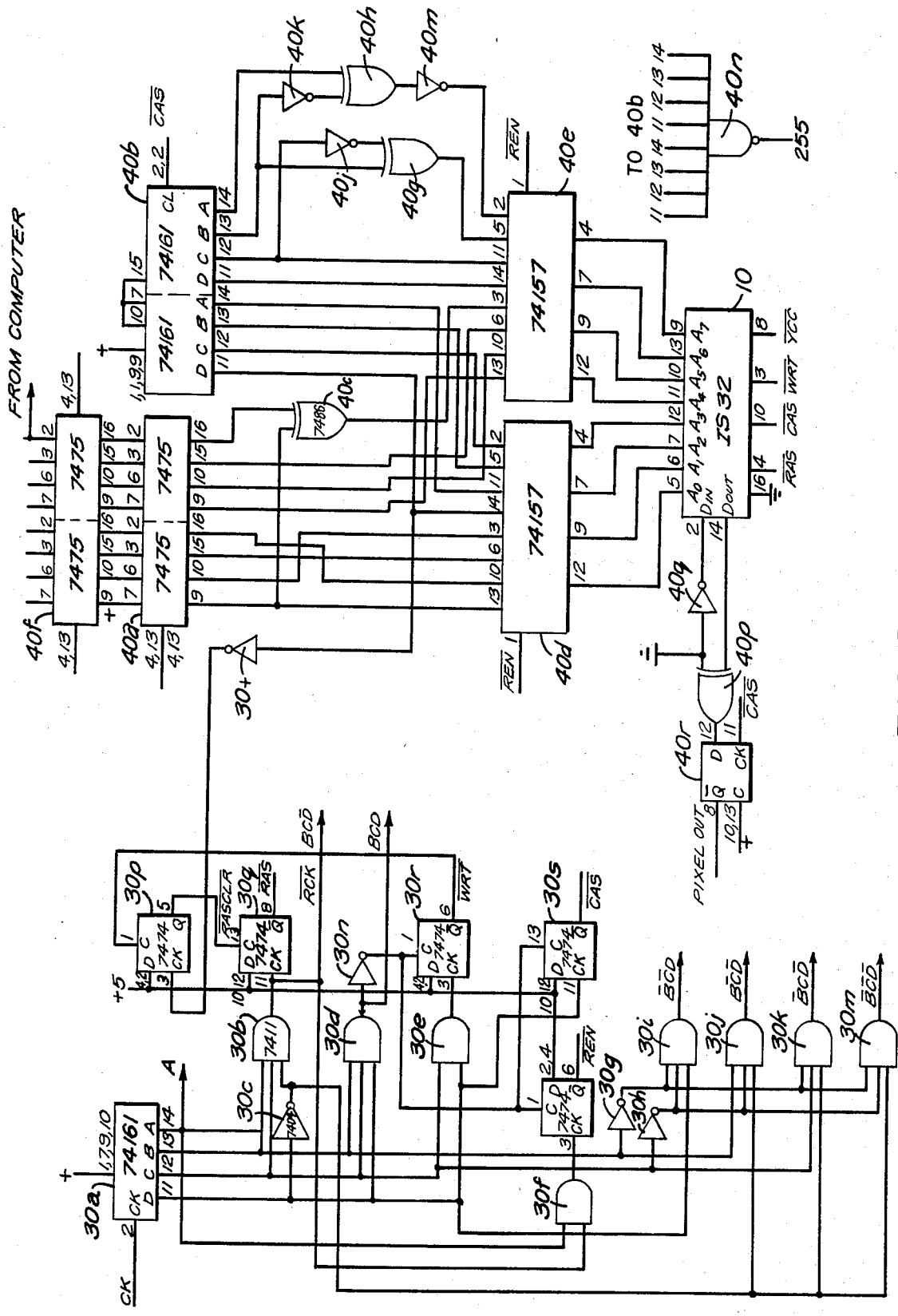
FIGS. 3 and 4 are circuitry for implementing the block diagram of FIG. 2.
Figure 4:
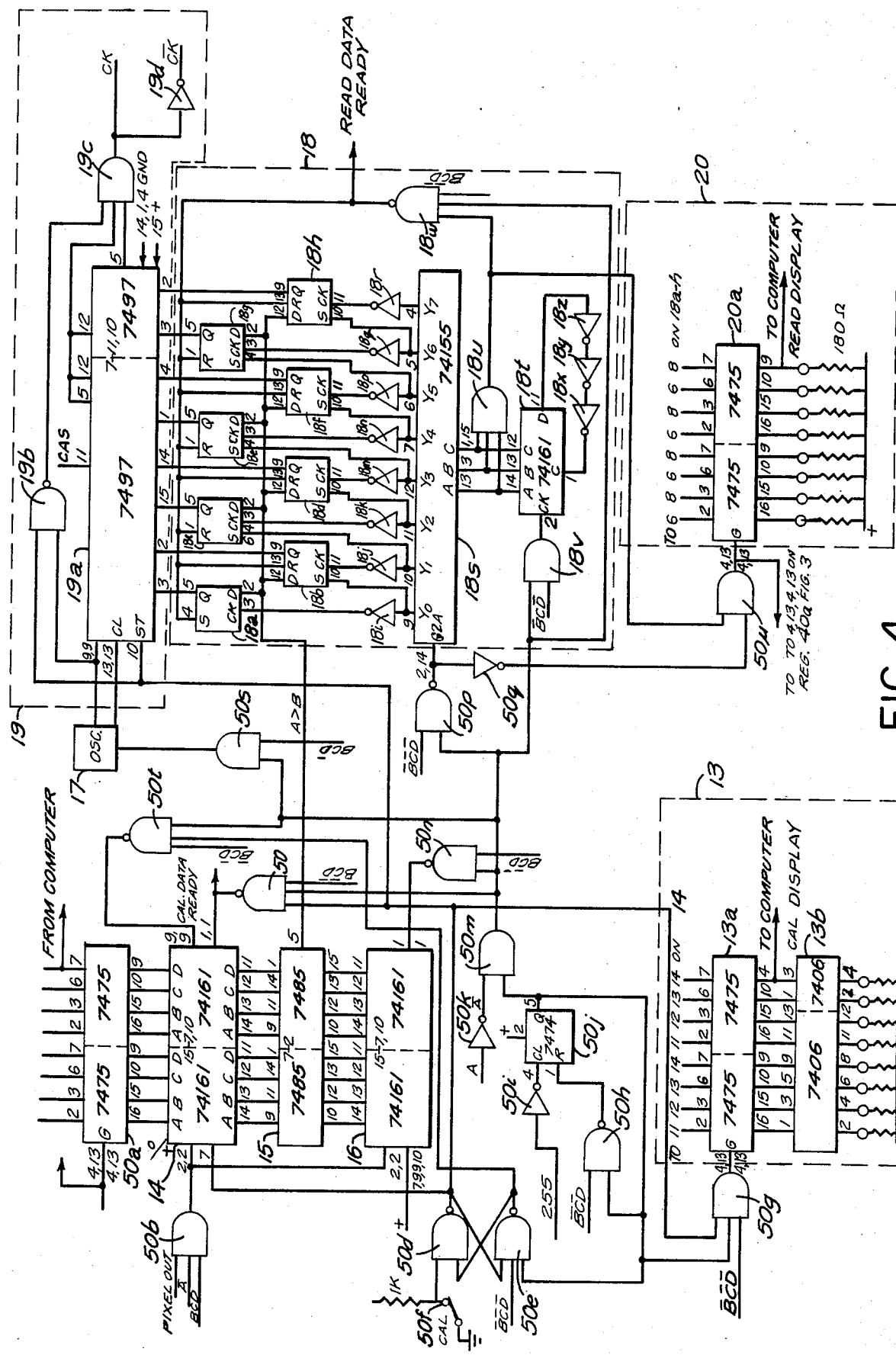

FIGS. 3 and 4 illustrate an implementation of the apparatus shown in block diagram form in FIG. 2, taken with a Hewlett-Packard HP 85 computer programmed in accordance with the program listing in Table I and the sample run set forth in Table II.

TABLE I

```
200 ! FILE NAME IS ARRAY4
210 ! PROGRAM FOR RUNNING AND CA
    LCULATING ARRAY TESTS
220 IMAGE DDD.D
222 DISP "NUMBER OF RUNS FOR EAC
    H VARIABLE"
223 INPUT H
224 DIM D(40),E(40)
225 G=1
226 P=0
230 DISP "INPUT CAL. WAVELENGTH"
240 INPUT L1
250 DISP "INPUT LAMP VOLTAGE"
255 INPUT V
256 DISP "INPUT DATE"
257 INPUT D1,D2
258 DISP "FILTER WAVELENGTH ="
259 INPUT L4
265 T=1.75
270 N=2 ! "NUMBER OF READINGS PE
    R TEST?"
280 DIM A(40),B(40)
281 PRINT "DATE   ";D1;D2
282 PRINT "FILTER WAVELENGTH= ";
    L4
291 PRINT "LAMP VOLTAGE=";V
292 PRINT "THRESHOLD VOLTAGE=";T
294 PRINT "CAL. WAVELENGTH=";L1
295 DISP "INPUT OSC. FREQUENCY"
296 INPUT F
297 PRINT "OSC. FREQ.=";F
302 GOSUB 1000 ! LOAD WAVELENGTH
303 PRINT
330 GOSUB 4000 ! READ CALIBRATIO
    N.
370 GOSUB 3000 ! LOAD CAL. COUNT
    ER.
380 DISP "SWITCH TO READ"
400 DISP "HIT CONTINUE WHEN READ
    Y FOR READING."
410 PAUSE
420 GOSUB 1994 ! READ DATA
1000 CONTROL 4,4 ; 128 ! STROBE
    HNDSHK.
1005 GOSUB 3500
1010 OUTPUT 405 USING "#,B" ; L2
1015 WAIT 1000
1020 RETURN
1994 G=1 @ DIM A$[38]
1995 FOR L1=120 TO 240 STEP 4
1996 GOSUB 1000
2000 CONTROL 4,3 ; 0 ! NORMAL FL
    GA.
2010 CONTROL 4,4 ; 64+1 ! PARTIA
    L HANDSHK,INVERT DATA.
2026 PRINT
2027 PRINT "WAVELENGTH=";L1
2028 PRINT "MEAN    S.D.    C.V."
2030 IOBUFFER A$
2040 ON EOT 4 GOTO 2070
2050 TRANSFER 400 TO A$ INTR ; C
    OUNT N
2060 X=X+1
2062 GOTO 2060
2064 END
2070 FOR K=1 TO N
2080 ENTER A$ USING "#,B" ; A(K)
2090 NEXT K
2100 M1=0
2110 S1=0
2120 FOR K=2 TO N
2130 M1=M1+A(K)
2140 NEXT K
2150 M1=M1/(N-1)
2160 FOR K=2 TO N
2170 S1=S1+(A(K)-M1)^2
2180 NEXT K
2190 S1=SQR(S1/(N-2))
2200 C1=S1/M1*100
2210 DISP USING 220 ; M1;S1;C1
2215 PRINT USING 220 ; M1;S1;C1
2216 D(G)=L1 @ E(G)=M1
2217 G=G+1
2219 P=G-1
2220 NEXT L1
2230 GOTO 6000
3000 CONTROL 4,4 ; 128 ! STROBE
    HNDSHK.
3010 OUTPUT 404 USING "#,B" ; M2
3020 RETURN
3490 DIM X(10)
3500 FOR J=0 TO 7
3510 X(J)=L1\2^J
3520 X(J)=X(J)-2*(X(J)\2)
3530 NEXT J
3540 Y0=NOT (X(0) EXOR X(1))
3550 Y1=X(2)
3560 Y2=NOT (X(1) EXOR X(2))
3570 Y3=X(3)
3580 Y4=X(6)
3590 Y5=X(4)
3600 Y6=X(5)
3610 Y7=X(7)
3630 L2=Y0+2*Y1+4*Y2+8*Y3+16*Y4+
    32*Y5+64*Y6+128*Y7
3635 RETURN
3640 PRINT DTB$(L2)
3650 PRINT "NEXT WAVELENGTH";
3660 INPUT L1
3670 PRINT L1
3680 PRINT
3690 GOTO 3500
4000 CONTROL 4,4 ; 64 ! PARTIAL
    HNDSHK.
4010 CONTROL 4,3 ; 32 ! INVERT F
    LGB.
4011 PRINT "CAL. VALUES"
4012 PRINT "MEAN    S.D.    C.V."
4015 Q=0
4016 M3=0 @ C3=0
4020 DIM B$[38]
4030 IOBUFFER B$
4040 ON EOT 4 GOTO 4070
4050 TRANSFER 401 TO B$ INTR ; C
    OUNT N
4055 X=0
4060 X=X+1
4062 GOTO 4060
4064 END
4070 FOR K=1 TO N
4080 ENTER B$ USING "#,B" ; B(K)
```

TABLE I (Cont'd.)

```
4090 NEXT K
4100 M2=0
4110 S2=0
4120 FOR K=1 TO N
4130 M2=M2+B(K)
4140 NEXT K
4150 M2=M2/N
4160 FOR K=1 TO N
4170 S2=S2+(B(K)-M2)^2
4180 NEXT K
4190 S2=SQR(S2/(N-1))
4210 C2=S2/M2*100
4220 DISP USING 220 ; M2;S2;C2
4225 DISP DTB$(M2)
4227 PRINT USING 220 ; M2;S2;C2
4228 PRINT
4230 Q=Q+1
5030 RETURN
6000 GCLEAR
6010 SCALE -100,300,-100,300
6020 XAXIS 0,100,0,300
6030 YAXIS 0,100,0,300
6040 FOR G=1 TO P
6050 PLOT D(G)/H,E(G)/H
6070 NEXT G
6075 PENUP
6080 LDIR 0
6100 FOR X=0 TO 250 STEP 100
6110 MOVE X,-30
6120 LABEL VAL$(X)
6130 NEXT X
6140 FOR Y=0 TO 250 STEP 100
6150 MOVE -50,Y
6160 LABEL VAL$(Y)
6170 NEXT Y
6180 MOVE 70,-60
6190 LABEL "WAVELENGTH"
6200 MOVE -60,70
6210 LDIR 90
6220 LABEL "A-D VALUE"
6230 END
```

TABLE II

FILTER WAVELENGTH= 620
LAMP VOLTAGE= 6.02
THRESHOLD VOLTAGE= 1.75
CAL. WAVELENGTH= 160
OSC. FREQ.= 130000

CAL. VALUES
MEAN    S.D.   C.V.
101.0   0.0    0.0

WAVELENGTH= 120
MEAN    S.D.   C.V.
 1.0.

WAVELENGTH= 124
MEAN    S.D.   C.V.
 1.0.

WAVELENGTH= 128
MEAN    S.D.   C.V.
 1.0.

WAVELENGTH= 132
MEAN    S.D.   C.V.
 1.0.

WAVELENGTH= 136
MEAN    S.D.   C.V.
 1.0.

WAVELENGTH= 140
MEAN    S.D.   C.V.
 2.0.

WAVELENGTH= 144
MEAN    S.D.   C.V.
 4.0.

WAVELENGTH= 148
MEAN    S.D.   C.V.
 27.0.

WAVELENGTH= 152
MEAN    S.D.   C.V.
104.0.

WAVELENGTH= 156
MEAN    S.D.   C.V.
194.0.

WAVELENGTH= 160
MEAN    S.D.   C.V.
243.0.

WAVELENGTH= 164
MEAN    S.D.   C.V.
163.0.

WAVELENGTH= 168
MEAN    S.D.   C.V.
 80.0.

WAVELENGTH= 172
MEAN    S.D.   C.V.
 20.0.

WAVELENGTH= 176
MEAN    S.D.   C.V.
 6.0.

WAVELENGTH= 180
MEAN    S.D.   C.V.
 3.0.

WAVELENGTH= 184
MEAN    S.D.   C.V.
 2.0.

WAVELENGTH= 188
MEAN    S.D.   C.V.
 1.0.

WAVELENGTH= 192
MEAN    S.D.   C.V.
 1.0.

WAVELENGTH= 196
MEAN    S.D.   C.V.
 1.0.

WAVELENGTH= 200
MEAN    S.D.   C.V.
 0.0.

WAVELENGTH= 204
MEAN    S.D.   C.V.
 0.0.

TABLE II (Cont'd.)

```
WAVELENGTH= 208
MEAN    S.D.    C.V.
 0.0.

WAVELENGTH= 212
MEAN    S.D.    C.V.
 0.0.

WAVELENGTH= 216
MEAN    S.D.    C.V.
 0.0.

WAVELENGTH= 220
MEAN    S.D.    C.V.
 0.0.

WAVELENGTH= 224
MEAN    S.D.    C.V.
 0.0.

WAVELENGTH= 228
MEAN    S.D.    C.V.
 0.0.

WAVELENGTH= 232
MEAN    S.D.    C.V.
 0.0.

WAVELENGTH= 236
MEAN    S.D.    C.V.
 0.0.

WAVELENGTH= 240
MEAN    S.D.    C.V.
 0.0.
```

FIGS. 3 and 4 also indicate thereon the particular type of integrated circuit utilized, where necessary, as well as the pin number for the dip package thereof. It should be noted that the ordinary gates do not have the pin numbers nor the integrated circuit types listed therewith since these are well known to those skilled in the art.

Display 13 comprises an 8-bit latch circuit 13a which feeds 8 display line drivers 13b for driving LED display. The latch 13a receives the data outputs from counter 14 and the output lines from latch 13a feed the computer 11.

Display 20 for the register 18 comprises latch 20a which receives the outputs from flip-flops 18a–18h and whose output is fed to the computer and to LED display elements.

Reference counter 14 comprises standard counting circuitry, which has the additional that it is capable of being preloaded from a latch 50a which receives the reference count from computer 11.

The rate multiplier 19 receives the output from oscillator 17 and includes a frequency divider integrated circuit 19a and logic elements 19b, 19c and 19d for generating a clock signal CK and its inverse. These signals are used in FIG. 3 to generate the timing signals for the circuitry as will be explained hereinafter.

The register 18 comprises the aforementioned 8 flip-flops 18a–18h which are driven at their clock inputs by inverters 18–18r whose inputs are fed from a three line to eight line decoder 18s whose input is counter 18t. This circuit, by means of the attendant logic gates 18u–18z, initially sets flip-flop 18a and either resets same or lets this flip-flop remain set depending upon the output from magnitude comparator 15. The circuitry thereafter sequentially sets the remaining flip-flops 18b–18h and either resets same or lets the flip-flop remain in the set state depending upon the output of the magnitude comparator 15. In this way the rate multiplier is able to generate the frequency signal defined heretofore and at the same time the flip-flops 18a–18h hold the coverted digital data word for the particular row of the image sensor 10.

Control logic circuitry 50a–50u is used to define the calibration and measuring modes of the circuitry and to control the input and output to the counters 14 and 16 to the register 18. Switch 50f followed by the flip-flop from gates 50d and 50e select the calibration mode, thereby enabling counter 14 to receive the output of the image sensor via gate 50b. The remaining gates utilize timing signals generated in FIG. 3 for insuring that the proper relative timing is carried out in the device.

Circuitry 40a–40r is used to control the signals to and from the image sensor 10. Latch 40f is provided for receiving row address data from the computer 11 and latch 40a is provided for holding the current address for the image sensor 10. Counter 40b is provided for counting through the 256 columns of each row and gate 40n is provided for receiving the count information from counter 40b to define when the last column has been counted for terminating the conversion cycle for a particular row. Logic elements 40c and 40g–40m are used to define the particular address for the image sensor 10.

Multiplexers 40d and 40e are used to receive both the row and column addresses simultaneously and to select one or the other during the reading and writing cycles of the image sensor in order to access the particular row and column of interest. This is necessary in view of the fact that only 8 address inputs are provided on the device 10 although 16 address bits are necessary.

The data input of the image sensor 10 is always connected to a logic 1 so that after reading thereof the element is reset for the next cycle. The data output is received through gate 40p into flip-flop 40r to define the input signal for counters 14 and 16.

The timing signals which are generated in order to effect a synchronous operation of the device in accordance with the procedure set forth hereinabove, are generated by counter 30a which receives the clock signal from the rate multiplier 19 as well as logic gates 30b–30t which define the various combinations of timing signals B, C and D from counter 30a as well as the control signals for the image sensor 10. The timing for the image sensor 10 is defined in accordance with the manufacturer specifications thereof and is incorporated by reference herein.

It will be appreciated that the instant specification and claims are set forth by way of illustration and not limitation, and that various modifications and changes can be made without departing from the spirit and scope of the present invention.

What is claimed is:

1. A method for converting radiant energy levels to digital data, comprising the steps of:
   (a) providing an image sensor having at least one row of sensor elements each including a light sensitive capacitor and an access switch and which changes state and produces a corresponding binary output signal when a predetermined charge threshold is exceeded by the capacitor whose charge is a function of intensity and period of an illumination;
   (b) calibrating said row of elements by illuminating same with a reference light source and sensing at a first frequency (F) such that approximately one-half of the elements change state and counting the digital output signals corresponding to the changes of state to obtain a first number (B);

(c) illuminating said row with an unknown light source which has a lower radiant energy level than that of said reference light source, sensing at a frequency F/2 and counting the digital output signals corresponding to the changes of state to obtain a second number (A);

(d) comparing A and B and producing a digital "1" signal when A>B and a digital "0" when A<B corresponding to digital data bit $N_1$; and (e) repeating steps (c) and (d) for each successive bit $N_2, N_3 \ldots N_k$ of digital data at successive sensing frequencies in accordance with $$\frac{F \times N_1}{2^1} + \frac{F \times N_2}{2^2} + \frac{F \times N_3}{2^3} + \ldots \frac{F \times N_k}{2^k}.$$

2. The method according to claim 1, wherein the image sensor has a plurality of rows and wherein steps (b–e) are repeated for each row.

3. The method according to claim 1, wherein the digital output signals during the step of calibrating are counted in a first counter and the digital output signals counted for the unknown light source are counted in a second counter.

4. The method according to claim 3, wherein each digital data bit $N_1, N_2, N_3 \ldots N_k$ for said row is successively stored in a K-bit register.

5. The method according to claim 4, wherein step (c) comprises multiplying the output frequency of an oscillator by successive ratios in response to the data bits stored in the K-bit register.

6. The method according to claim 1, further comprising calculating the radiant energy of the unknown light source by multiplying the radiant energy of the reference light source by the K-bit digital data.

7. An apparatus for converting radiant energy levels to digital data, comprising:

(a) an image sensor having at least one row of sensor elements each including a light sensitive capacitor and an access switch and which changes state and produces a corresponding binary output signal when a predetermined charge threshold is exceeded by the capacitor whose charge is a function of intensity and period of an illumination;

(b) means for calibrating said row of elements in response to the illumination thereof same with a reference light source and sensing at a first sensing frequency (F) such that approximately one-half of the elements change state and for counting the digital output signals corresponding to the changes of state to obtain a first number (B);

(c) means for controlling the image sensor upon illumination of said row with an unknown light source which has a lower radiant energy level than that of said reference light source, to sense at a frequency F/2 and count the digital output signals corresponding to the changes of state to obtain a second number (A);

(d) means for comparing A and B to produce a digital "1" signal when A>B and a digital "0" when A<B corresponding to digital data bit $N_1$; and (e) wherein said controlling means includes means for repeating the sensing and comparing for each successive bit $N_2, N_3 \ldots N_k$ of digital data with the sensing at successive sensing frequencies in accordance with $$\frac{F \times N_1}{2^1} + \frac{F \times N_2}{2^2} + \frac{F \times N_3}{2^3} + \ldots \frac{F \times N_k}{2^k}.$$

8. The apparatus according to claim 7, wherein the image sensor has a plurality of rows and wherein the controlling means includes means for repeating the sensing and comparing for each row.

9. The apparatus according to claim 7, wherein the means for counting the digital output signals during calibrating comprises a first counter and the means for counting the digital output signals for the unknown light source comprises a second counter.

10. The apparatus according to claim 9, further comprising means for successively storing each digital data bit $N_1, N_2, N_3 \ldots N_k$ for said row.

11. The apparatus according to claim 10, wherein the means for sensing at successive frequencies comprises an oscillator and a frequency rate multiplier receptive of the data from the storing means.

12. The apparatus according to claim 7, further comprising means calculating the radiant energy of the unknown light source including means for multiplying the radiant energy of the references light source by the K-bit digital data.

* * * * *